(12) United States Patent
Kim et al.

(10) Patent No.: US 12,400,970 B2
(45) Date of Patent: Aug. 26, 2025

(54) SEMICONDUCTOR PACKAGE INCLUDING ELECTROMAGNETIC SHIELD STRUCTURE

(71) Applicant: SAMSUNG ELECTRONICS CO., LTD., Suwon-si (KR)

(72) Inventors: Jongwan Kim, Cheonan-si (KR); Yongkwan Lee, Hwaseong-si (KR); Kyonghwan Koh, Anyang-si (KR); Seunghwan Kim, Anyang-si (KR); Jungjoo Kim, Hwaseong-si (KR); Junwoo Park, Anyang-si (KR); Taejun Jeon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 651 days.

(21) Appl. No.: 17/745,601

(22) Filed: May 16, 2022

(65) Prior Publication Data

US 2023/0114892 A1 Apr. 13, 2023

(30) Foreign Application Priority Data

Oct. 12, 2021 (KR) .................. 10-2021-0135217

(51) Int. Cl.
*H01L 23/552* (2006.01)
*H01L 23/00* (2006.01)
(Continued)

(52) U.S. Cl.
CPC .......... *H01L 23/552* (2013.01); *H01L 23/295* (2013.01); *H01L 23/3128* (2013.01); *H01L 23/66* (2013.01); *H01L 24/16* (2013.01); *H01L 24/32* (2013.01); *H01L 24/73* (2013.01); *H01L 2223/6605* (2013.01); *H01L 2223/6677* (2013.01); *H01L 2224/16227* (2013.01); *H01L 2224/16237* (2013.01); *H01L 2224/32225* (2013.01); *H01L 2224/73204* (2013.01); *H01L 2924/1421* (2013.01); *H01L 2924/2027* (2013.01); *H01L 2924/3025* (2013.01)

(58) Field of Classification Search
CPC ... H01L 21/561; H01L 23/552; H01L 25/065; H01L 23/49822; H01L 23/49827; H01L 23/66; H01L 23/295; H01L 23/3128; H01L 24/13; H01L 24/16; H01L 24/32; H01L 24/73; H01L 24/81; H01L 25/105
USPC .......................................... 257/678
See application file for complete search history.

(56) References Cited

U.S. PATENT DOCUMENTS 8,653,633 B2 2/2014 Liao et al.
8,872,312 B2 10/2014 Wang et al.
(Continued)

FOREIGN PATENT DOCUMENTS

KR 101689833 1/2017
KR 101899239 9/2018

*Primary Examiner* — Fazli Erdem
(74) *Attorney, Agent, or Firm* — Fish & Richardson P.C.

(57) ABSTRACT

A semiconductor package includes; a package substrate, a semiconductor chip on the package substrate, an electromagnetic shield structure on the package substrate and including an upper cover covering an upper surface of the semiconductor chip and a side cover surrounding the semiconductor chip, and a sealing member contacting the semiconductor chip and the electromagnetic shield structure, wherein the side cover includes first through holes and the upper cover includes second through holes.

20 Claims, 11 Drawing Sheets

(51) Int. Cl.
   *H01L 23/29*   (2006.01)
   *H01L 23/31*   (2006.01)
   *H01L 23/66*   (2006.01)

(56)  References Cited

U.S. PATENT DOCUMENTS

| | | |
|---|---|---|
| 8,987,872 B2 | 3/2015 | Hwang et al. |
| 9,070,793 B2 * | 6/2015 | Liao .................... H01L 23/3121 |
| 9,466,784 B2 | 10/2016 | Arai |
| 9,613,913 B2 | 4/2017 | Choi et al. |
| 9,681,234 B2 | 6/2017 | Yuan et al. |
| 10,727,082 B2 | 7/2020 | Chang et al. |
| 10,775,197 B2 | 9/2020 | Fuji et al. |
| 2020/0152580 A1 * | 5/2020 | Kim .................. H01L 23/49822 |
| 2020/0312797 A1 * | 10/2020 | Kang ................. H01L 23/3114 |
| 2020/0373259 A1 * | 11/2020 | Koller ................. H01L 21/4853 |
| 2020/0381368 A1 | 12/2020 | Park |
| 2021/0035917 A1 | 2/2021 | Fay et al. |
| 2021/0398923 A1 * | 12/2021 | Kang ................. H01L 23/5389 |

* cited by examiner

SEMICONDUCTOR PACKAGE INCLUDING ELECTROMAGNETIC SHIELD STRUCTURE

CROSS-REFERENCE TO RELATED APPLICATION

This application claims priority under 35 U.S.C. § 119 to Korean Patent Application No. 10-2021-0135217 filed on Oct. 12, 2021 in the Korean Intellectual Property Office, the subject matter of which is hereby incorporated by reference in its entirety.

BACKGROUND

The inventive concept relates generally to semiconductor packages, and more particularly to semiconductor packages including an electromagnetic shield structure.

Increasing integration density for electronic devices caused by continuing reductions in physical size, together with consumer demands for expanded functionality and improved performance place enormous demands on constituent electronic components, such as semiconductor devices. For example, improved shielding against electromagnetic interference (EMI) is an increasingly noteworthy consideration in the design and fabrication of electronic components and electronic devices including same.

SUMMARY

Embodiments of the inventive concept provide semiconductor devices including an electromagnetic shield structure, wherein such embodiments of the inventive concept exhibit improved immunity to electromagnetic interference.

According to an aspect of the inventive concept, a semiconductor package may include; a package substrate, a semiconductor chip on the package substrate, an electromagnetic shield structure on the package substrate and including an upper cover covering an upper surface of the semiconductor chip and a side cover surrounding the semiconductor chip, and a sealing member contacting the semiconductor chip and the electromagnetic shield structure, wherein the side cover includes first through holes and the upper cover includes second through holes.

According to an aspect of the inventive concept, a semiconductor package may include; a package substrate including a base, first upper substrate pads on an upper surface of the package substrate, second upper substrate pads on the upper surface of the package substrate, and an internal interconnection pattern within the base and connected to the first upper substrate pads, a semiconductor chip including chip connecting bumps respectively connected to the first upper substrate pads, an electromagnetic shield structure on the package substrate and including an upper cover covering an upper surface of the semiconductor chip and a side cover surrounding the semiconductor chip, wherein the side cover is electrically connected to the second upper substrate pads and ground, and a sealing member between the semiconductor chip and the electromagnetic shield structure, wherein the side cover includes first through holes, and the sealing member fills the first through holes.

According to an aspect of the inventive concept, a semiconductor package may include; a package substrate including first upper substrate pads on an upper surface of the package substrate and second upper substrate pads connected to ground and on the upper surface of the package substrate, a radio frequency integrated circuit mounted on the package substrate using chip connecting bumps respectively connected to the first upper substrate pads, wherein the radio frequency integrated circuit is configured to communicate a radio frequency signal having a wavelength k, an electromagnetic shield structure mounted on the package substrate using the second upper substrate pads and including an upper cover covering an upper surface of the radio frequency integrated circuit and a side cover surrounding side surfaces of the radio frequency integrated circuit, wherein the side cover is penetrated by regularly spaced first through holes and the upper cover is penetrated by regularly spaced second through holes, and a sealing member disposed between the electromagnetic shield structure and the radio frequency integrated circuit, surrounding the chip connecting bumps, and including a filler having a particle size, wherein a thickness of the upper cover and a thickness of the side cover ranges between about 200 μm to about 1,000 μm, a first size of the first through holes and a second size of the second through holes are each at least twice that of the particle size, and the first size of the first through holes and the second size of the second through holes are each less than or equal to $\lambda/50$.

BRIEF DESCRIPTION OF THE DRAWINGS

Advantages, benefits, features and related aspects, as well as the making and use of the inventive concept may be more clearly understood upon consideration of the following detailed description together with the accompanying drawings, in which.

DETAILED DESCRIPTION

Throughout the written description and drawings, like reference numbers and labels are used to denote like or similar elements, components, method steps and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
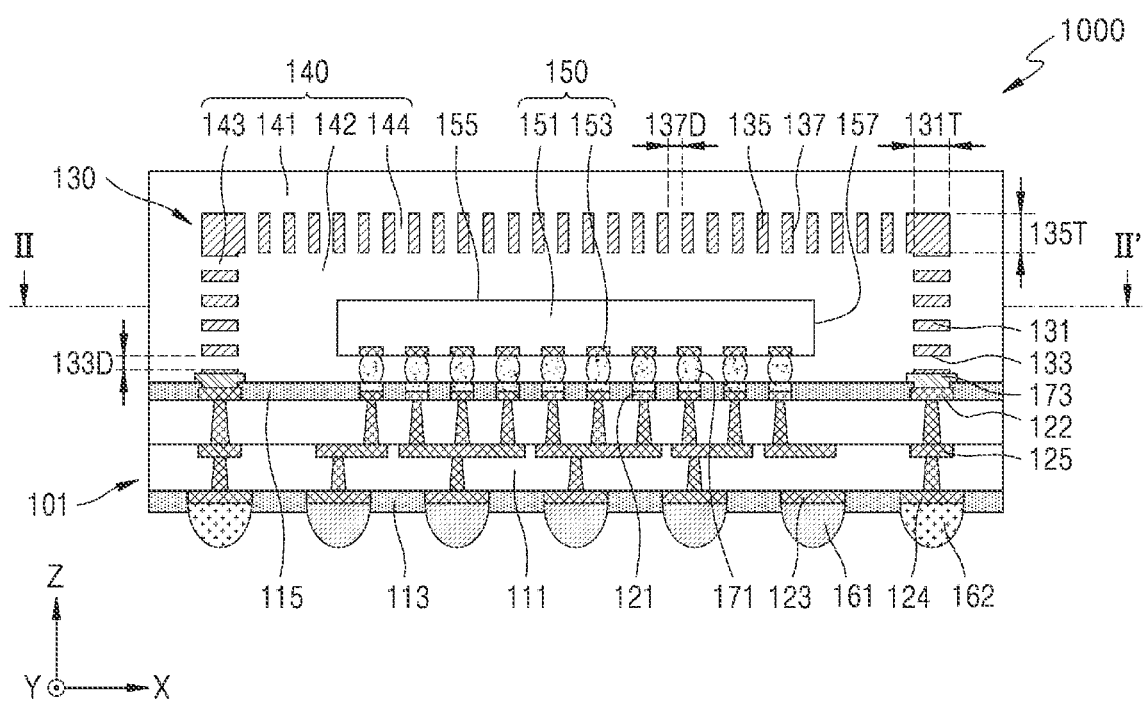
FIG. 1 is a cross-sectional view illustrating a semiconductor package according to embodiments of the inventive concept.
Figure 2:
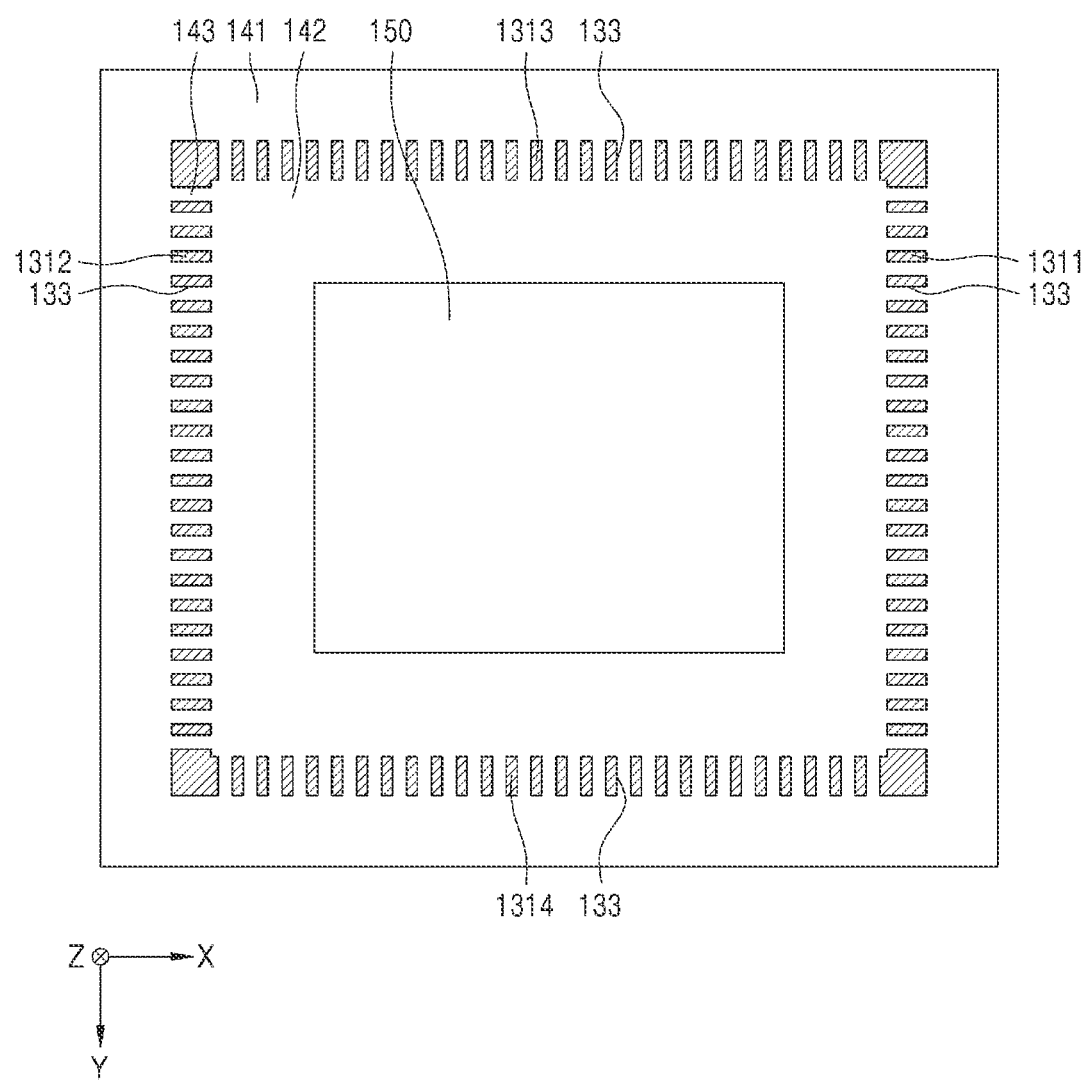
FIG. 2 is a plan (or top-down) view taken along line II-II' of FIG. 1 and further illustrating the semiconductor package of FIG. 1.
Figure 3:
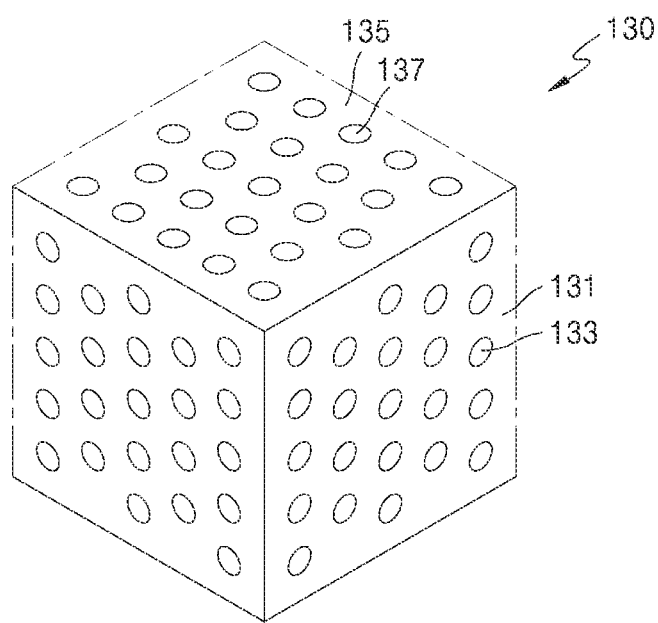
FIG. 3 is a perspective view illustrating, in part, an electromagnetic shield structure associated with semiconductor packages according to embodiments of the inventive concept.

FIG. 1 is a cross-sectional view illustrating a semiconductor package 1000 according to embodiments of the inventive concept, FIG. 2 is a plan view taken along line II-II' of the semiconductor package 1000, and FIG. 3 is a perspective view further illustrating, in part, an electromagnetic shield structure 130 of the semiconductor package 1000.

Referring to FIGS. 1, 2 and 3, the semiconductor package 1000 may include a package substrate 101, a semiconductor chip 150, an electromagnetic shield structure 130, and a sealing member 140.

The package substrate 101 may include a substrate base 111, first upper substrate pads 121, second upper substrate pads 122, first lower substrate pads 123, second lower substrate pads 124, and an internal interconnect pattern 125. The package substrate 101 may be, for example, a printed circuit board (PCB).

The substrate base 111 may include at least one of phenol resin, epoxy resin, and polyimide.

The first upper substrate pads 121 and the second upper substrate pads 122 may be provided on an upper surface of the substrate base 111. The first lower substrate pads 123 and the second lower substrate pads 124 may be provided on a lower surface of the substrate base 111.

The internal interconnect pattern 125 may be variously configured and provided within, wholly or in part, the substrate base 111. Thus, the internal interconnect pattern 125 may variously and electrically connect the first upper substrate pads 121, the second upper substrate pads 122, the first lower substrate pads 123, and/or the second lower substrate pads 124. In some embodiments, the internal interconnect pattern 125 may include line patterns extending in at least one of a first (or X-) horizontal direction and a second (or Y-) horizontal direction within the substrate base 111. Alternately or additionally, the internal interconnection pattern 125 may include via patterns extending in a vertical (or Z-) direction within the substrate base 111.

The package substrate 101 may further include an upper protective layer 115 provided on the upper surface of the substrate base 111 and a lower protective layer 113 provided on the lower surface of the substrate base 111. Here, the upper protective layer 115 and the lower protective layer 113 may include, for example, solder resist.

The first upper substrate pads 121, the second upper substrate pads 122, the first lower substrate pads 123, the second lower substrate pads 124, and/or the internal interconnect pattern 125 may variously include at least one of, for example, copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru).

The first upper substrate pads 121 may be used to respectively connect chip connecting bumps 171 (e.g., micro bumps) associated with the semiconductor chip 150 the semiconductor chip 150. That is, the chip connecting bumps 171 may be respectively connected to the first upper substrate pads 121 through openings provided in the upper protective layer 115.

The second upper substrate pads 122 may be used to connect (or attach) the electromagnetic shield structure 130. In this regard, a conductive bonding material layer 173 may be used to electrically connect the second upper substrate pads 122 and the electromagnetic shield structure 130. Hence, the conductive bonding material layer 173 may be provided between the second upper substrate pads 122 and the electromagnetic shield structure 130. Further in this regard, the conductive bonding material layer 173 may be connected to the second upper substrate pads 122 through openings provided in the upper protective layer 115. In some embodiments, the conductive bonding material layer 173 may include solder.

The first lower substrate pads 123 may be used to connect (or attach) first external connection terminals 161 and second external connection terminals 162.

The first external connection terminals 161 may be connected to the first lower substrate pads 123 through openings provided in the lower protective layer 113. Accordingly, the first external connection terminals 161 may be respectively and electrically connected to the first upper substrate pads 121 through the internal interconnect pattern 125. In this manner, the first external connection terminals 161 may be configured to electrically and physically connect the semiconductor package 1000 with an external device, and may be variously used as terminal(s) for communicating (e.g., transmitting and/or receiving) input/output (I/O) signals (e.g., at least one of power signals, a ground signal, command signals, control signals and/or address signals). In some embodiments, the first external connection terminals 161 may be configured to receive at least one power signal from an external device.

The external connection terminals 162 may be connected to the second lower substrate pads 124 through openings in the lower protective layer 113, and may be electrically connected through the second lower substrate pads 124 to the internal interconnect pattern 125. In some embodiments, the second external connection terminals 162 may be configured to receive a ground signal from an external device.

In some embodiments, the first external connection terminals 161 and/or the second external connection terminals 162 may be formed from, for example, solder balls or solder bumps.

The semiconductor chip 150 mounted on (e.g., mechanically assembled and/or electrically connected) the package substrate 101 may include a semiconductor substrate 151 and chip pads 153, wherein the chip pads 153 may be provided on a lower surface of the semiconductor chip 150.

In some embodiments, the semiconductor chip 150 may be mounted on the package substrate 101 in a face-down (or flip-chip) manner. That is, the semiconductor chip 150 may be mounted on the package substrate 101, such that the lower surface of the semiconductor chip 150 faces the package substrate 101. The chip pads 153 of the semiconductor chip 150 may be electrically connected to the first upper substrate pads 121 through the chip connecting bumps 171. The chip pads 153 of the semiconductor chip 150 may be used as terminals for variously communicating I/O signals associated with the semiconductor chip 150.

The semiconductor substrate 151 may include silicon (e.g., silicon, polycrystalline silicon, or amorphous silicon). The semiconductor substrate 151 may include an active surface and an opposing inactive surface, wherein the active surface of the semiconductor substrate 151 is the lower surface of the semiconductor chip 150, and the inactive surface of the semiconductor substrate 151 is the an upper surface 155 of the semiconductor chip 150. The semiconductor chip 150 may include a semiconductor device layer formed on the active surface of the semiconductor substrate 151. The chip pads 153 of the semiconductor chip 150 may be used to electrically connect to the semiconductor device layer through a wiring structure (not shown) provided (e.g.) within the semiconductor chip 150.

In some embodiments, the semiconductor chip 150 may include a volatile memory chip and/or a non-volatile memory chip. Here, the volatile memory chip may include, for example, a dynamic random access memory (RAM) (DRAM), a static RAM (SRAM), a thyristor RAM (TRAM), a zero capacitor RAM (ZRAM), or a twin transistor RAM (TTRAM). The non-volatile memory chip may include, for example, a flash memory, a magnetic RAM (MRAM), a spin-transfer torque MRAM (STT-MRAM), a ferroelectric RAM (FRAM), a phase change RAM (PRAM), a resistive RAM (RRAM), a nanotube RRAM (RRAM), a polymer RAM (polymer RAM), or an insulator resistance change memory.

Alternately or additionally, the semiconductor chip 150 may be a logic chip. The logic chip may include, for example, an artificial intelligence semiconductor, a microprocessor, a graphics processor, a signal processor, a network processor, a chipset, an audio codec, a video codec, and an application processor.

In some embodiments, the semiconductor chip 150 is a communication chip and may include a signal processing circuit for processing radio frequency (RF) signal(s). That is, in some embodiments, the semiconductor chip 150 may include a radio-frequency integrated circuit (RFIC).

Hence, in various embodiments, the semiconductor package 1000 may include one or more semiconductor chip(s) 150. For example, two or more, spaced apart semiconductor chips 150 may be arranged on the upper surface of the package substrate 101, wherein the two or more semiconductor chips 150 may be the same chip type, or different chip types.

The electromagnetic shield structure 130 may be mounted on the package substrate 101 to be vertically (e.g., in the vertical direction) and laterally (e.g., in the first and second horizontal directions) spaced apart from the semiconductor chip 150. The electromagnetic shield structure 130 may be mounted on the package substrate 101 using a surface mounting technique, for example. In this regard, the electromagnetic shield structure 130 may be physically and electrically connected to the second upper substrate pads 122 of the package substrate 101 through the conductive bonding material layer 173.

In its configuration, the electromagnetic shield structure 130 may substantially cover (or encompass) an upper surface 155 and side surfaces 157 of the semiconductor chip 150. For example, the electromagnetic shield structure 130 may have a cup-like shape that covers the semiconductor chip 150 and defines an internal space accommodating the semiconductor chip 150. (See. e.g., element 139 of FIG. 9). Hence, in various embodiments, the electromagnetic shield structure 130 may substantially cover the upper surface 155 of the semiconductor chip 150 and substantially surround the side surfaces 157 of the semiconductor chip 150. In some embodiments, a thickness of the electromagnetic shield structure 130 may be substantially uniform.

It its shape and constituent nature, the electromagnetic shield structure 130 will "shield" (or suppress) the emission of electromagnetic energy generated by the semiconductor chip 150 during its operation, such that the potentially interfering electromagnetic energy (e.g., electromagnetic waves, electrical frequencies and/or magnetic fields) is not communicated the outside the semiconductor package 1000. Additionally, the electromagnetic shield structure 130 will shield the semiconductor chip 150 from potentially interfering electromagnetic energy generated outside the semiconductor package 1000. For example, the electromagnetic shield structure 130 may be configured to shield electromagnetic interference by reflecting and/or absorbing electromagnetic energy. In some embodiments, the electromagnetic shield structure 130 may be configured to shield electromagnetic energy in one or more defined frequency band(s).

In this regard, the electromagnetic shield structure 130 may include at least one of, for example, metal, magnetic material, carbon, ceramic, polymer, etc. In some embodiments, the electromagnetic shield structure 130 may include Cu, silver (Ag), and/or ferrite. The electromagnetic shield structure 130 may have a single-layer structure or a multi-layer structure. For example, the multi-layer electromagnetic shield structure 130 may include a second material layer stacked on a first material layer, different from the first material layer.

Accordingly, in some embodiments, the second upper substrate pads 122 may be electrically grounded. Hence, the second upper substrate pads 122 may be referred to as "ground pads." For example, the second upper substrate pads 122 may be connected to the second external connection terminals 162, which are connected to ground through the internal interconnect pattern 125. The conductive bonding material layer 173, the second upper substrate pads 122, the internal interconnect pattern 125, and the second lower substrate pads 124 may form an electrical connection path between the electromagnetic shield structure 130 and the second external connection terminal 162 through which electromagnetic energy may be absorbed (or transferred) away from the semiconductor chip 150 using the electromagnetic shield structure 130.

In some embodiments, the electromagnetic shield structure 130 may be understood as including a side cover 131 laterally surrounding the semiconductor chip 150 and an upper cover 135 covering the upper surface 155 of the semiconductor chip 150.

The upper cover 135 of the electromagnetic shield structure 130 may have a flat plate-like shape (e.g., a rectangular, flat, plate-like shape). The planar (or lateral) area of the upper cover 135 may be greater than a planar area of the semiconductor chip 150, and the upper cover 135 may entirely cover the upper surface 155 of the semiconductor chip 150.

The side cover 131 of the electromagnetic shield structure 130 may have a ring-like shape continuously extending along the circumference of the semiconductor chip 150 to surround the semiconductor chip 150. For example, the side cover 131 may have a rectangular, ring-like shape. Thus, the side cover 131 may be spaced apart from, and respectively face (e.g., laterally oppose in one of the first horizontal direction and the second horizontal direction) the sidewalls 157 of the semiconductor chip 150. A height of the side cover 131 may be greater than a height of the side surfaces 157 of the semiconductor chip 150.

The side cover 131 may extend from outer edges of the upper cover 135 to the upper surface of the package substrate 101. In some embodiments, the side cover 131 may extend substantially linearly (e.g., vertically) from the outer edges of the upper cover 135 to the upper surface of the package substrate 101, wherein a lower edge of the side cover 131 may contact the conductive bonding material layer 173.

The side cover 131 may include a first through hole 133. The first through hole 133 may laterally penetrate (e.g., in the X-direction and/or the Y-direction) through the side cover 131, wherein the first through holes 133 may be spaced apart one from the other in the side cover 131. In some embodiments, the first through holes 133 may be regularly or uniformly spaced in the side cover 131 according to a defined density. Here, the "density" of the first through holes 133 may be understood as a number of first through holes 133 in a unit area of the side cover 131. In some embodiments, arrangement(s) of the first through holes 133 may be spaced apart at regular intervals. In some embodiments, the first through holes 133 may have the same dimension(s) (e.g., size, diameter, shape, etc.).

The upper cover 135 may include second through holes 137, wherein the second through holes 137 may vertically penetrate the upper cover 135. The second through holes 137 may be regularly spaced apart from one another in the upper cover 135 according to a defined density. In some embodiments, arrangement(s) of the second through holes 137 may be regularly spaced apart. In some embodiments, the second through holes 137 may have the same dimension(s) (e.g., size, diameter, shape, etc.).

In some embodiments, a first size 133D for the first through hole 133 and a second size 137D for the second through holes 137 may be the same. Here, the first size 133D may denote a maximum width (or diameter) for the first through holes 133, and the second size 137D may denote a maximum width (or diameter) for the second through holes 137.

In some embodiments, when a distance between respective centers of two, adjacent first through holes 133 may define a first pitch, and a distance between respective centers of two, adjacent second through holes 137 may define a second pitch. In some embodiments, the first pitch may be the same as the second pitch.

The sealing member 140 may be provided on the package substrate 101. The sealing member 140 may cover at least a portion of the package substrate 101, at least a portion of the semiconductor chip 150, and at least a portion of the electromagnetic shield structure 130. The sealing member 140 may protect the semiconductor chip 150 and the electromagnetic shield structure 130 from mechanical shock and/or contamination.

In some embodiments, the sealing member 140 may include an epoxy-group resin or a polyimide-group resin. For example, the sealing member 140 may include an epoxy molding compound (EMC) and/or a photosensitive material such as a photo imagable encapsulant (PIE). In some embodiments, the sealing member 140 may include a base resin including an epoxy-group resin or a polyimide-group resin and a filler contained in the base resin 181. (See, e.g., elements 181 and 183 of FIG. 9, wherein filler 183 may include an inorganic filler (e.g., silica) and/or an organic filler).

The sealing member 140 may include an outer portion 141 covering an outer surface of the electromagnetic shield structure 130, an inner portion 142 provided between an inner surface of the electromagnetic shield structure 130 and the semiconductor chip 150, first hole fillings 143 filling the first through holes 133 of the side cover 131, and second hole fillings 144 filling the second through holes 137 of the upper cover 135. The inner portion 142 of the sealing member 140 may cover the upper surface 155 and the sidewalls 157 of the semiconductor chip 150, and may fill a gap between the semiconductor chip 150 and the package substrate 101, thereby contacting the chip connecting bumps 171. The outer portion 141, the inner portion 142, the first hole fillings 143, and the second hole fillings 144 of the sealing member 140 may include one or more of the same (or different) material(s).

In some embodiments, in order to form the sealing member 140, constituent sealing material(s) (e.g., 180 of FIG. 9) of the sealing member 140 may be provided on the outer surface of the electromagnetic shield structure 130. The sealing material(s) 180 provided on the outer surface of the electromagnetic shield structure 130 may be introduced to the inside of the electromagnetic shield structure 130 through the first through holes 133 of the side cover 131 and/or the second through holes 137 of the upper cover 135. The sealing material(s) 180 introduced to the inside of the electromagnetic shield structure 130 may cover the upper surface 155 and the sidewalls 157 of the semiconductor chip 150. Also, the sealing material(s) 180 introduced to the inside of the electromagnetic shield structure 130 may fill a gap between the semiconductor chip 150 and the package substrate 101, as well as substantially surround the chip connecting bumps 171.

In some embodiments, the side cover 131 may have a rectangular ring-like shape extending around the circumference of the semiconductor chip 150 having a rectangular shape. The side cover 131 having a rectangular ring-like shape may include four (4) segments 1311, 1312, 1313, and 1314 linearly extending in relation to the first and second horizontal directions. For example, the side cover 131 may include a first segment 1311 and a second segment 1312 extending in the second horizontal direction, as well as a third segment 1313 and a fourth segment 1314 extending in the first horizontal direction. Here, the first through holes 133 may be formed at regular intervals in each of the four segments 1311, 1312, 1313, and 1314 of the side cover 131. Assuming this exemplary configuration, during the forming of the sealing member 140, the sealing material 180 may be introduced towards the semiconductor chip 150 from different directions through the first through holes 133 penetrating the four segments 1311, 1312, 1313, and 1314 of the side cover 131. In this manner, the internal space 139 of the electromagnetic shield structure 130 may be sufficiently filled by the sealing member 140.

In some embodiments, the first size 133D of the first through hole 133 and the second size 137D of the second through holes 137 may each be greater than a particle size (e.g., element 183D of FIG. 9) of the filler 183 included in the sealing member 140 in order to readily facilitate the introduction of the sealing material 180 through the first through holes 133 and the second through holes 137 of the electromagnetic shield structure 130. In some embodiments, the first size 133D of the first through hole 133 and the second size 137D of the second through holes 137 may be at least twice the particle size 183D of the filler 183 included in the sealing member 140. In some embodiments, when the diameter of the filler 183 included in the sealing member 140 is about 55 micrometers (μm), the first size 133D of the first through hole 133 and the second size 137D of the second through holes 137 may be at least about 110 μm.

In some embodiments, the electromagnetic shield structure 130 may be configured to exhibit a shielding effectiveness (SE) of at least 99% for a defined frequency band. Here, the SE may be defined by Equation (1) below, wherein 'λ' denotes a wavelength of electromagnetic energy incident to the electromagnetic shield structure 130, 'l' denotes a maximum width of through holes provided in the electromagnetic shield structure 130 (e.g., a first maximum width for the first through holes 133 and a second maximum width for the second through holes 137), and 'n' denotes a number of through holes provided in the electromagnetic shield structure 130.

$$S.E.[dB] = 20\log\left(\frac{\lambda}{2l}\right) - 10\log n \quad \text{Equation (1)}$$

In this regard, Table 1 below is a conversion table in which the SE per decibel (dB) is converted into the SE per percentage (%):

TABLE 1

| Shielding Effectiveness (dB) | Shielding Efficiency (%) |
|---|---|
| 0 | 0 |
| 10 | 90 |
| 20 | 99 |
| 30 | 99.39 |
| 40 | 99.99 |
| 50 | 99.999 |
| 60 | 99.9999 |
| 70 | 99.99999 |
| 80 | 99.999999 |
| 90 | 99.9999999 |

In some embodiments, the electromagnetic shield structure 130 may be configured to exhibit an SE of at least 99% for a defined frequency band based on Equation (1) and Table 1. In some embodiments, the first size 133D of the first through holes 133 and the second size 137D of the second through holes 137 provided in the electromagnetic shield structure 130 and/or the numbers of the first through holes 133 and the second through holes 137 provided in the electromagnetic shield structure 130 may be variously adjusted in order to ensure that the electromagnetic shield structure 130 exhibits an SE of at least 99% for the defined wavelength band.

In some embodiments, when the electromagnetic shield structure 130 is configured to shield electromagnetic waves having a first wavelength $\lambda 1$, the first size 133D of the first through hole 133 and the second size 137D of the second through holes 137 may each be $\lambda 1/20$ or less or $\lambda 1/50$ or less. In this regard, if the first size 133D of the first through hole 133 and/or the second size 137D of the second through holes 137 are too large, the SE associated with the first wavelength $\lambda 1$ may rapidly deteriorate.

In some embodiments assuming that the semiconductor chip 150 is an RFIC configured to radiate electromagnetic energy at the first wavelength $\lambda 1$ (e.g., a maximum operation frequency), the first size 133D of the first through holes 133 and the second size 137D of the second through holes 137 may each be set to $\lambda 1/50$ or less. For example, further assuming that the maximum operation frequency of the semiconductor chip 150 is 11.660 Gbps (5.830 GHz), the first size 133D of the first through holes 133 and the second size 137D of the second through holes 137 may each be set to 1.03 mm or less.

Alternately, a degree to which electromagnetic energy is shielded by the electromagnetic shield structure 130 may be expressed in terms of skin depth. Here, "skin depth" refers to a propagation length of electromagnetic energy until the intensity of the electromagnetic energy absorbed by the electromagnetic shield structure 130 is attenuated to 1/e. In this regard, skin depth may be represented by Equation (2) below, wherein '$\delta$' denotes skin depth, '$\rho$' denotes resistivity ($\mu\Omega$ cm) of the electromagnetic shield structure 130, 'f' denotes the frequency of the electromagnetic energy, and '$\mu$' denotes permeability of the electromagnetic shield structure 130.

$$\text{skin depth } \delta = \sqrt{\frac{\rho}{\pi \times f \times \mu}} \quad \text{Equation (2)}$$

For example, assuming electromagnetic energy in a high frequency band, the skin depth may be relatively short and the length of the electromagnetic energy traveling within the electromagnetic shield structure 130 is relatively small. Therefore, the high-frequency electromagnetic energy may be adequately shielded by the electromagnetic shield structure 130 having a relatively thin thickness. In contrast, assuming electromagnetic energy in a low frequency band, the skin depth may be relatively long and the length of the electromagnetic energy traveling within the electromagnetic shield structure 130 is relatively long. Therefore, the thickness of the electromagnetic shield structure 130 required to adequately shield the electromagnetic energy in a low frequency band must be relatively thicker.

Figure 4:
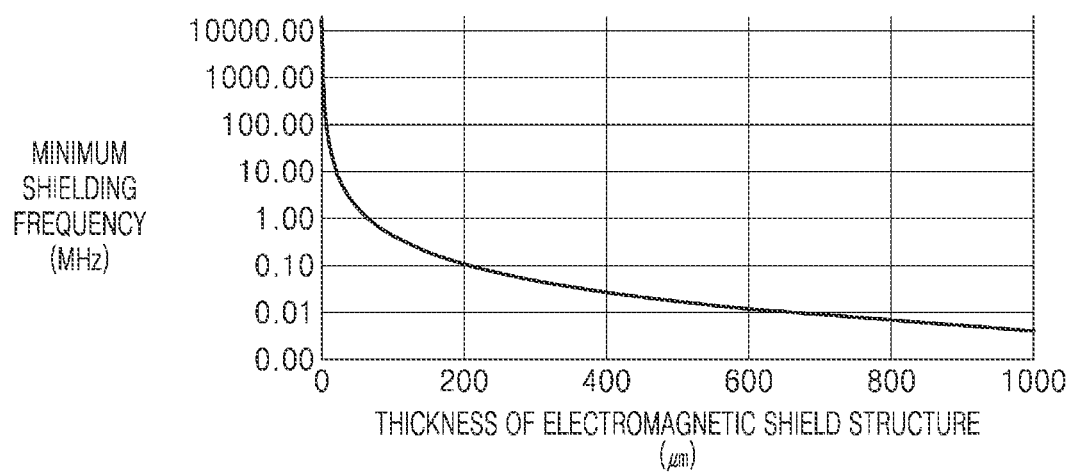
FIG. 4 is a graph showing a relationship between a thickness of an electromagnetic shield structure and the minimum shielding frequency shielded by the electromagnetic shield structure.

FIG. 4 is a graph illustrating a relationship between a thickness of the electromagnetic shield structure 130 and a minimum shielding frequency that may be adequately shielded by the electromagnetic shield structure 130.

In FIG. 4, the horizontal axis represents the thickness of the electromagnetic shield structure 130, and the vertical axis represents the minimum shielding frequency (i.e., the minimum frequency of electromagnetic waves that may be shielded by the electromagnetic shield structure 130).

Referring to FIGS. 1, 2, 3, and 4, the minimum shielding frequency may be adjusted by adjusting the thickness of the electromagnetic shield structure 130. That is, by adjusting a first thickness 131T of the side cover 131 and a second thickness 135T of the upper cover 135, the range of shielding frequencies shielded by the electromagnetic shield structure 130 may be adjusted. In some embodiments, the first thickness 131T of the side cover 131 and the second thickness 135T of the upper cover 135 may be adjusted across a range of from about 200 µm to about 1000 µm. Accordingly, as indicated in the graph of FIG. 4, a minimum frequency of electromagnetic energy shielded by the electromagnetic shield structure 130 may range from about 0.004 MHz to about 0.11 MHz. Thus, the electromagnetic shield structure 130 may be used to effectively shield electromagnetic energy in a low frequency band.

Figure 5:
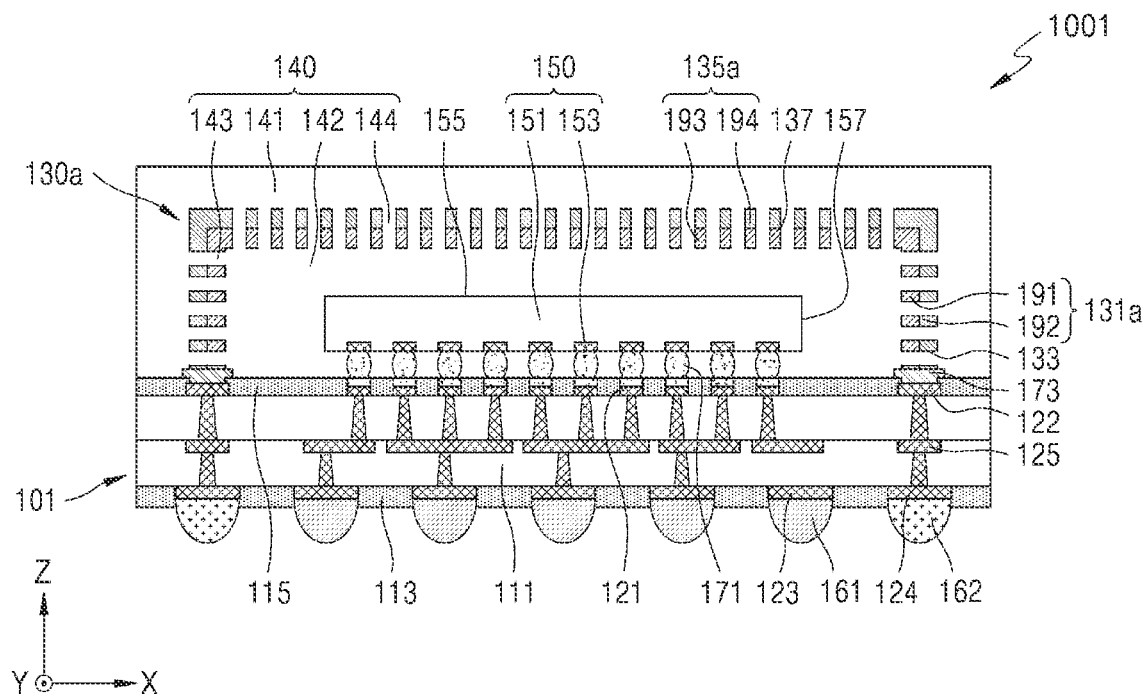
FIGS. 5, 6 and 7 are respective cross-sectional views illustrating various semiconductor packages according to embodiments of the inventive concept.

FIG. 5 is a cross-sectional view illustrating a semiconductor package 1001 according to embodiments of the inventive concept. Hereinafter, the semiconductor package 1001 of FIG. 5 will be described primarily in relation to differences from the semiconductor package 1000 of FIGS. 1, 2 and 3.

Referring to FIG. 5, in addition to the package substrate 101, the semiconductor chip 150 and the sealing member 140, the semiconductor package 1001 may include an electromagnetic shield structure 130a having a structure including multiple, stacked material layers.

In some embodiments, a side cover 131a of the electromagnetic shield structure 130a includes a first side shielding layer 191 of first material type, and a second side shielding layer 192 of second material type, different from the first material type. The second side shielding layer 192 of the side cover 131a may be stacked on the first side shielding layer 191 of the side cover 131a. For example, the first side shielding layer 191 of the side cover 131a may face the sidewalls 157 of the semiconductor chip 150, and the second side shielding layer 192 of the side cover 131a may be spaced apart from the sidewalls 157 of the semiconductor chip 150 by the first side shielding layer 191 of the side cover 131a interposed therebetween. In some embodiments, one of the first material type and the second material type may include Cu, and the other one of the first material type and the second material type may include a magnetic material (e.g., ferrite).

In some embodiments, an upper cover 135a may include a first upper shielding layer 193 of third material type and a second upper shielding layer 194 of fourth material type, different from the third material type. The second upper shielding layer 194 of the upper cover 135a may be stacked on the first upper shielding layer 193 of the upper cover 135a. For example, the first upper shielding layer 193 of the upper cover 135a may face the upper surface 155 of the semiconductor chip 150, and the second upper shielding layer 194 of the upper cover 135a may be spaced apart from the upper surface 155 of the semiconductor chip 150 by the first upper shielding layer 193 of the upper cover 135a interposed therebetween. The first upper shielding layer 193 of the upper cover 135a may be connected to the first side shielding layer 191 of the side cover 131a, and the second upper shielding layer 194 of the upper cover 135a may be connected to the second side shielding layer 192 of the side cover 131a. In some embodiments, the third material type may be the same as the first material type, and the fourth material type may be the same as the second material type. Alternately, in some embodiments, the third material type may be different from the first material type, and the fourth material type may be different from the second material type.

Although the electromagnetic shield structure 130a of FIG. 5 has been described in relation to a two layer structure, those skilled in the art will appreciate that more than two layers may be used to form the electromagnetic shield structure 130a. For example, the side cover 131a and the upper cover 135a may each have a structure in which three or more material layers are stacked.

Figure 6:
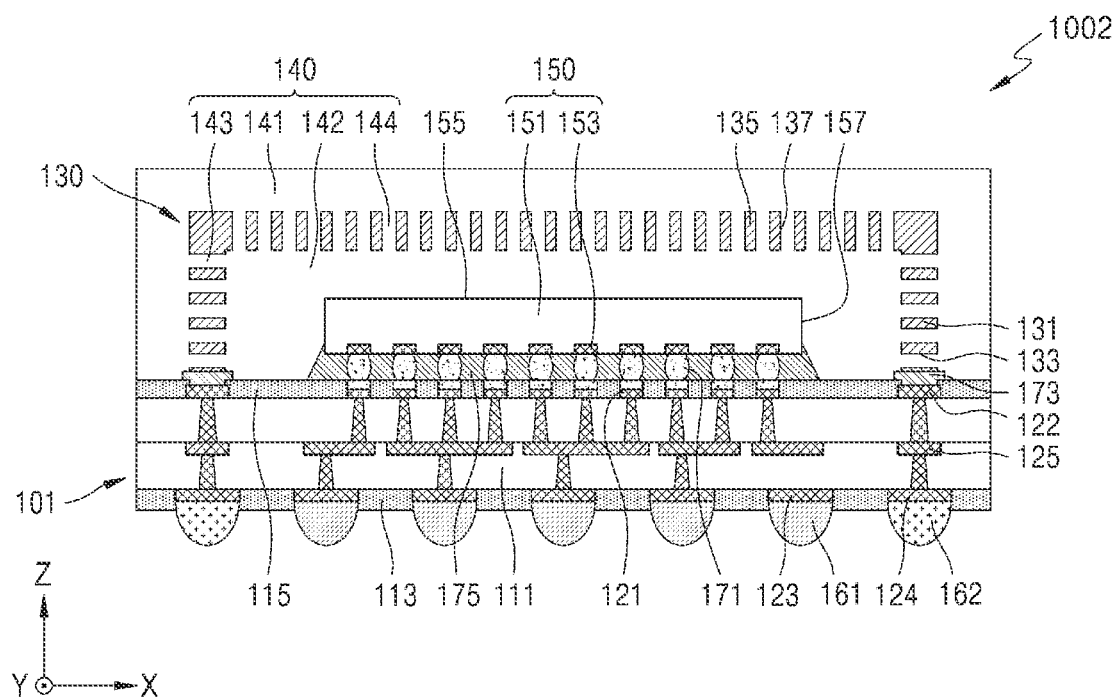

FIG. 6 is a cross-sectional view illustrating a semiconductor package 1002 according to embodiments of the inventive concept. Hereinafter, the semiconductor package 1002 of FIG. 6 will be described primarily in relation to differences from the semiconductor package 1000 of FIGS. 1, 2 and 3.

Referring to FIG. 6, the semiconductor package 1002 may additionally include an underfill material layer 175.

Here, the underfill material layer 175 may be provided between the semiconductor chip 150 and the package substrate 101 to substantially surround the chip connecting bumps 171. The underfill material layer 175 may include an epoxy resin and may be formed using a capillary underfill method. In some embodiments, the underfill material layer 175 may be formed using a non-conductive film. During a process of manufacturing the semiconductor package 1002, after formation of the underfill material layer 175 is complete, mounting of the electromagnetic shield structure 130 and formation of the sealing member 140 may be sequentially performed. The sealing member 140 may cover the upper surface 155 and the sidewalls 157 of the semiconductor chip 150 and may cover side surfaces of the underfill material layer 175.

Figure 7:
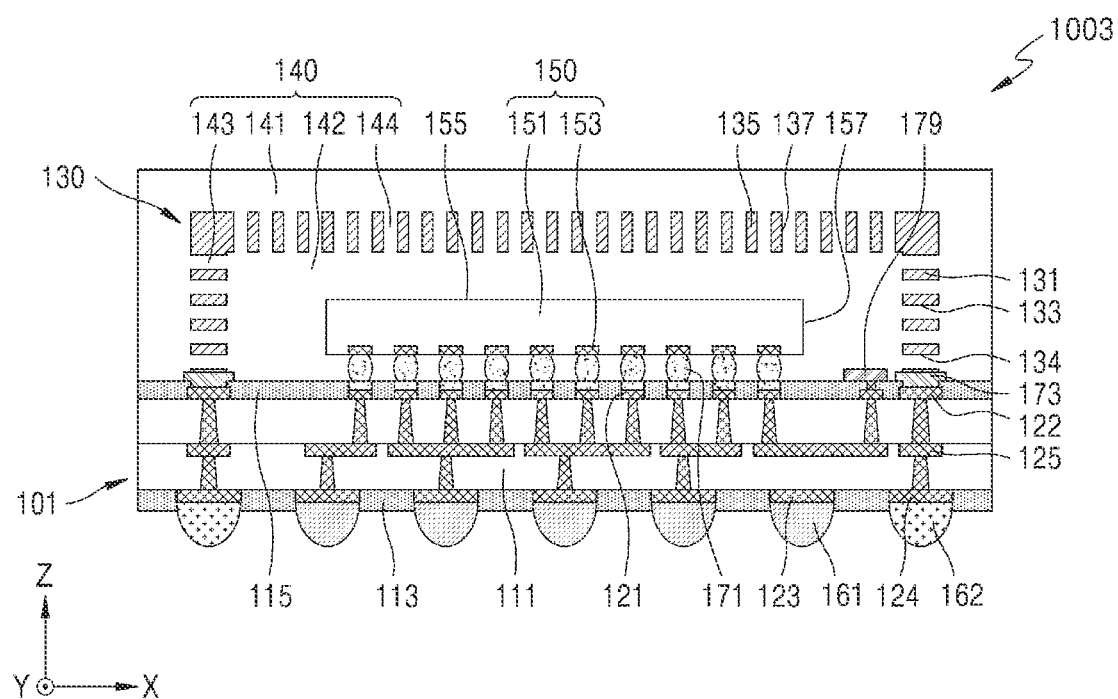

FIG. 7 is a cross-sectional view illustrating a semiconductor package 1003 according to embodiments of the inventive concept. Hereinafter, the semiconductor package 1003 of FIG. 7 will be described primarily in relation to differences from the semiconductor package 1000 of FIGS. 1, 2 and 3.

Referring to FIG. 7, the semiconductor package 1003 may further include an antenna pattern 179.

Here, the antenna pattern 179 may be configured to communicate RF signals. The antenna pattern 179 may be electrically connected to the semiconductor chip 150 including an RFIC and may transmit an RF signal in response to operation of the semiconductor chip 150 and/or receive an RF signal from an outside source. The antenna pattern 179 may be disposed on the package substrate 101. The antenna pattern 179 may include a metal. The antenna pattern 179 may have a structure suitable for the communication of RF signals. For example, the antenna pattern 179 may include a patch antenna, a dipole antenna, a meander, etc.

The antenna pattern 179 may be provided on the upper surface of the package substrate 101 and may be adjacent to the side cover 131 of the electromagnetic shield structure 130. In this case, an RF signal communicated by the antenna pattern 179 may be transmitted through a through hole 134 of the side cover 131 adjacent to the antenna pattern 179. In this regard, the through hole 134 of the side cover 131 adjacent to the antenna pattern 179 may have a size suitable for the communication of the RF signal and may have a size greater than that of the first through holes 133 provided in the side cover 131.

Figure 8A:
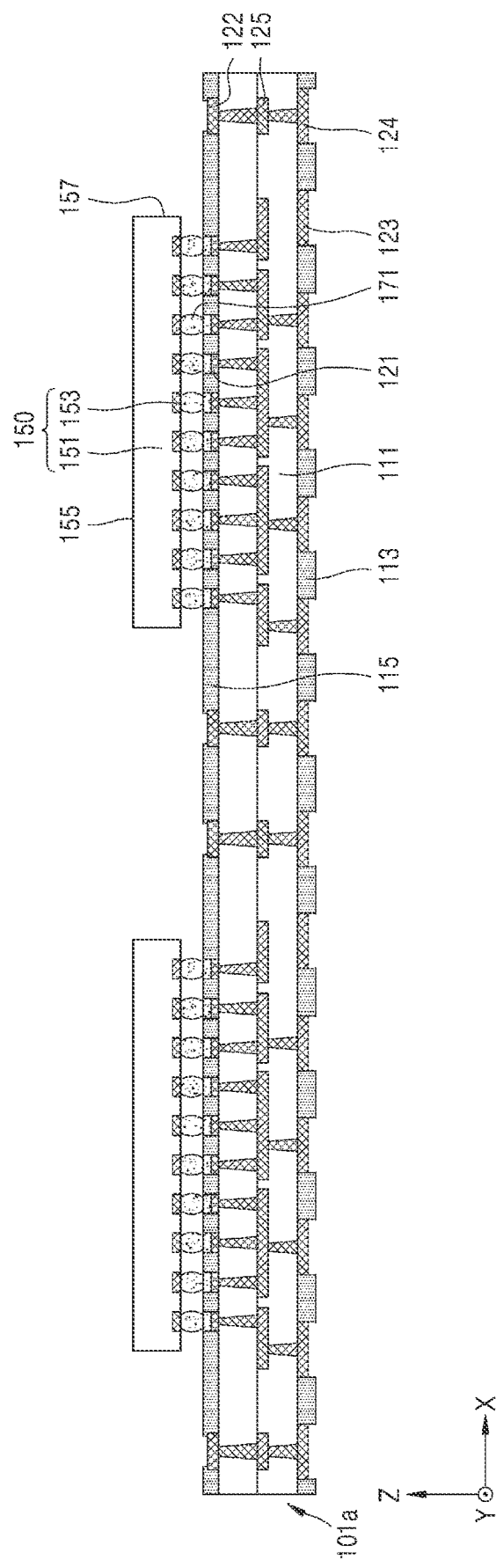
FIGS. 8A, 8B, 8C, 8D and 8E (hereafter collectively, "FIGS. 8A to 8E") are related cross-sectional views illustrating in one example a method of manufacturing a semiconductor package according to embodiments of the inventive concept.
Figure 8B:
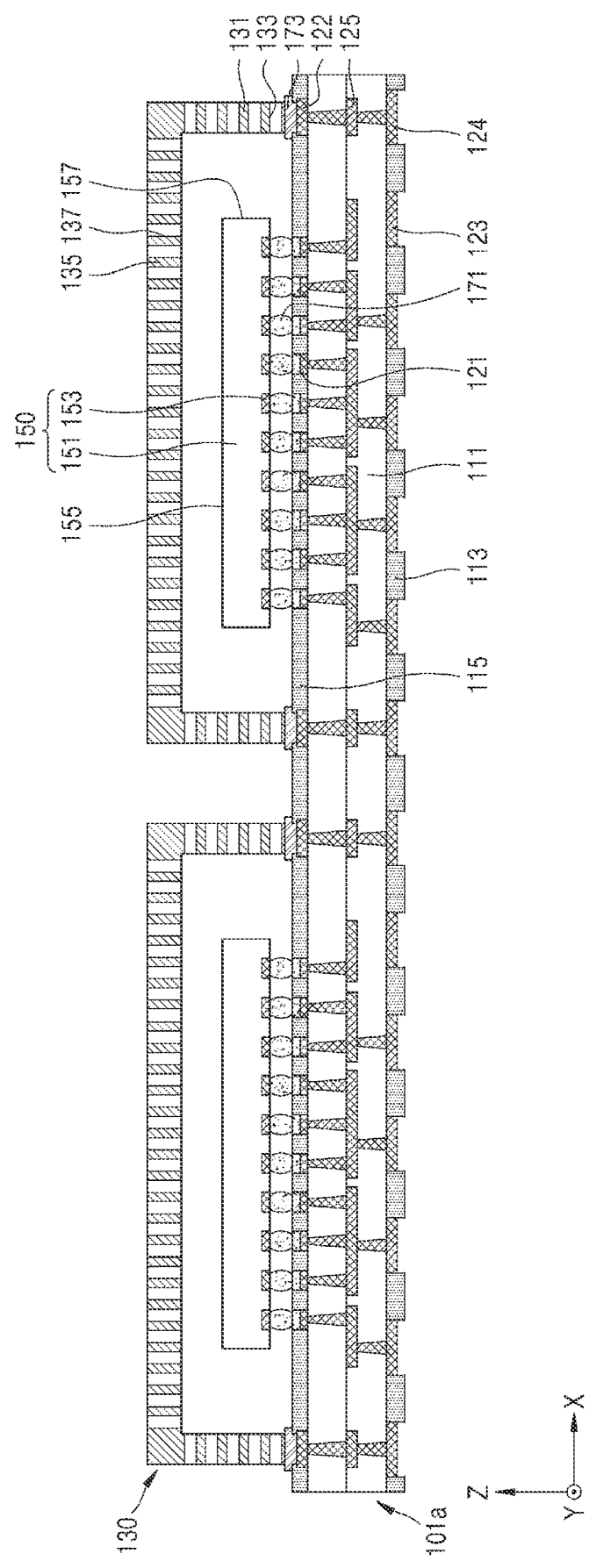
Figure 8C:
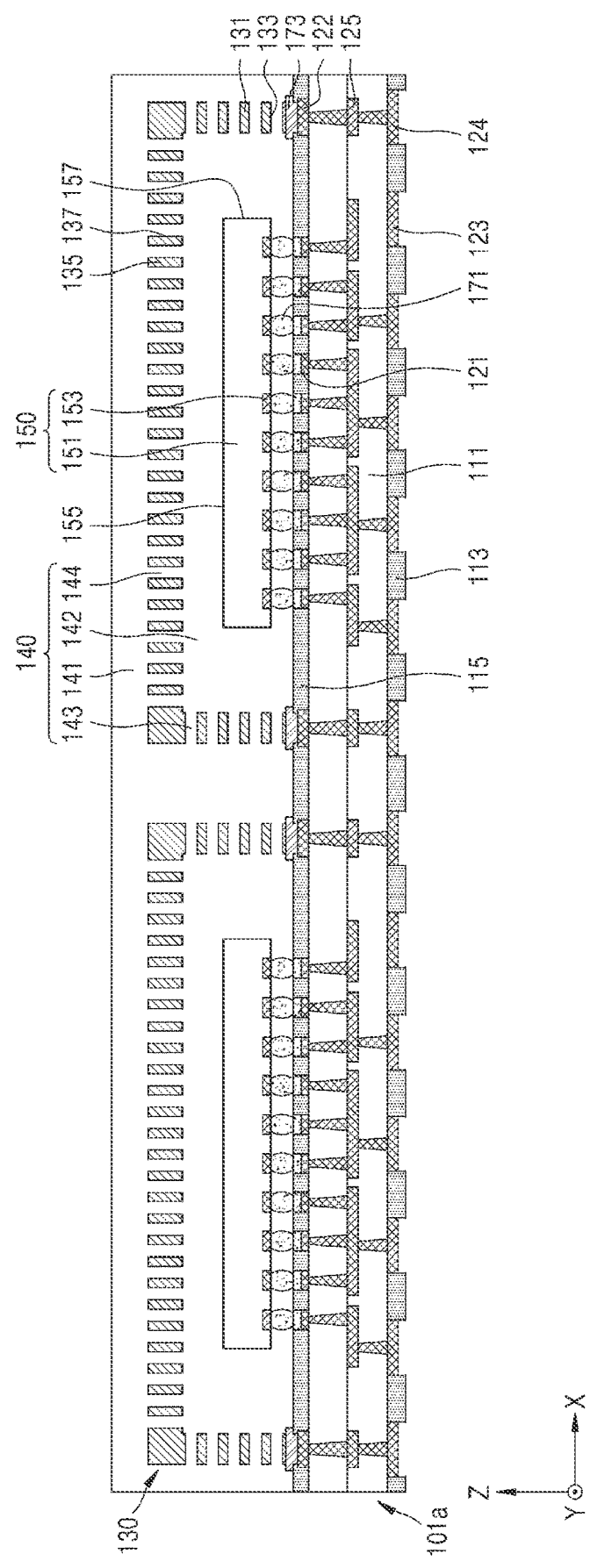
Figure 8D:
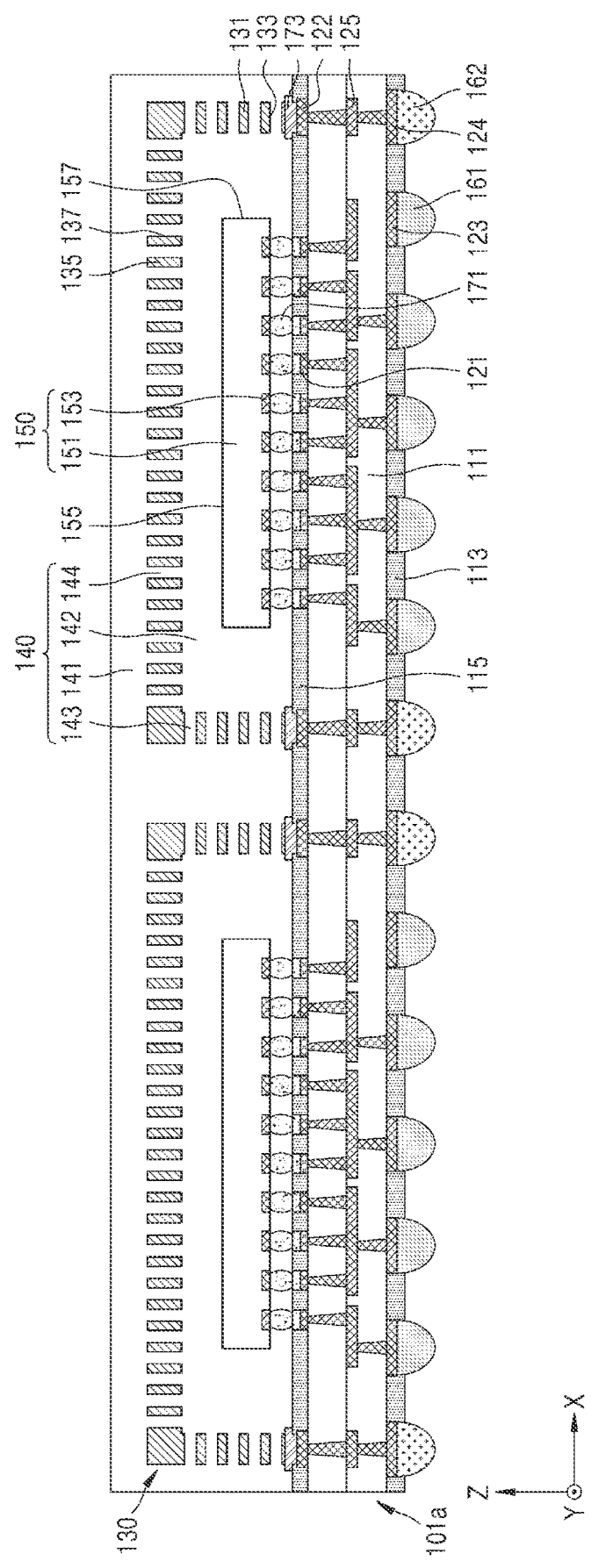
Figure 8E:
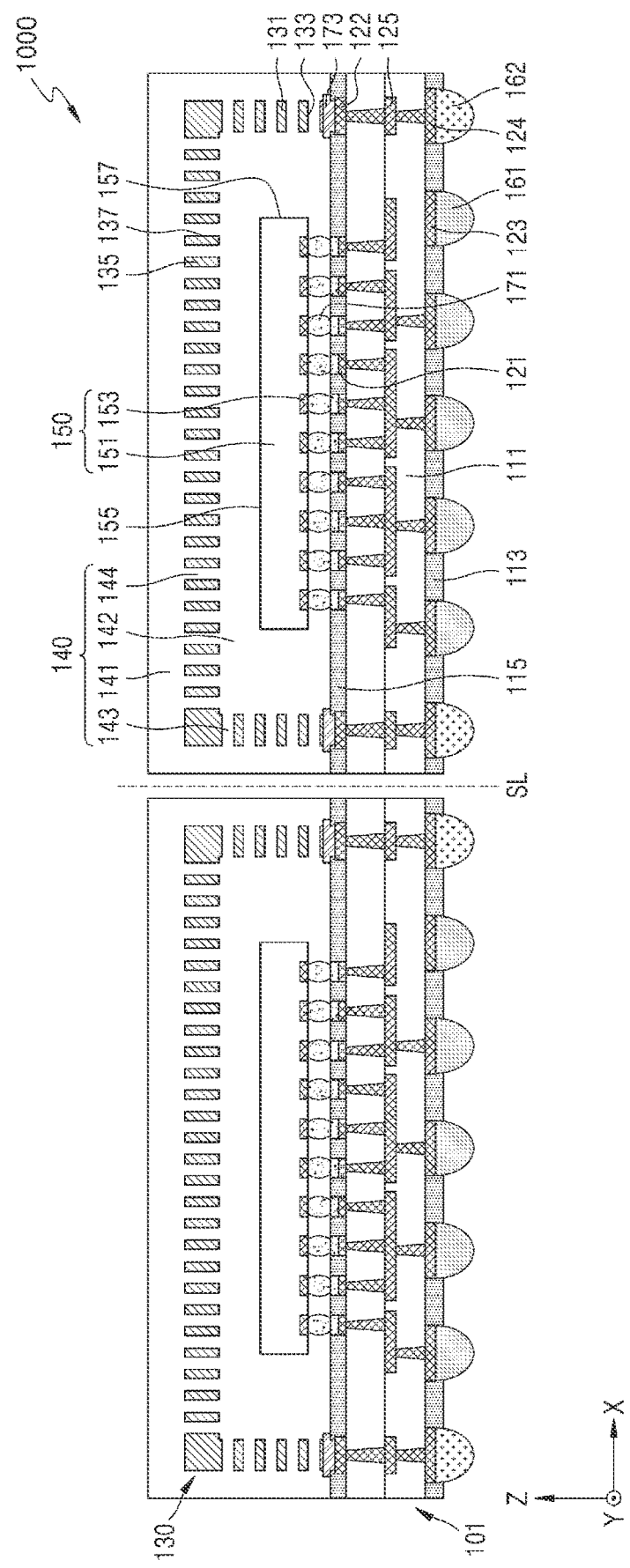
Figure 9:
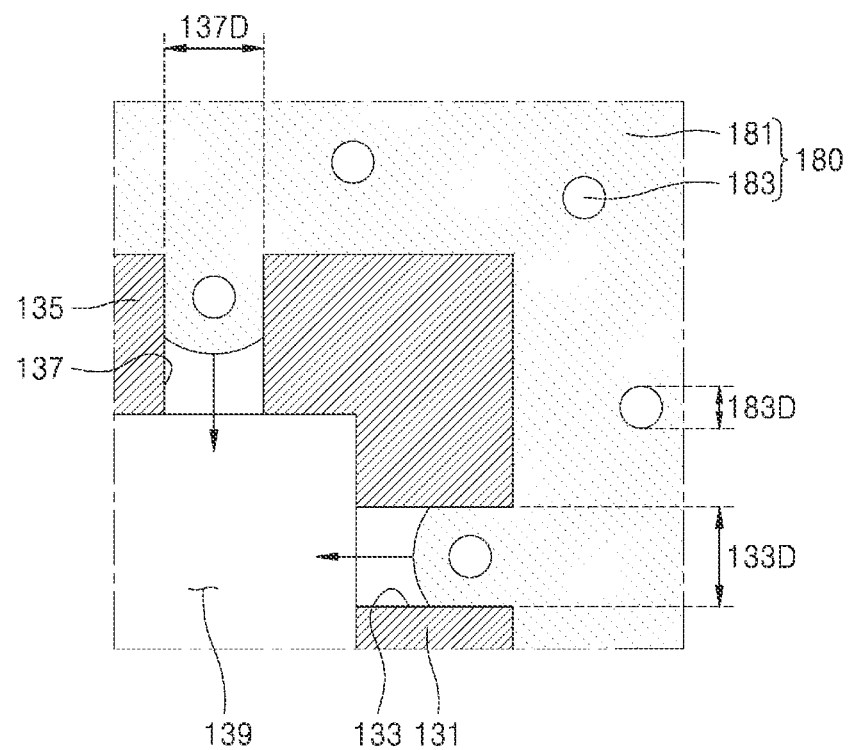
FIG. 9 is a cross-sectional view of further illustrating the forming of the sealing member in relation to the method of FIGS. 8A to 8E.

FIGS. 8A to 8E are related cross-sectional views illustrating in one example a method of manufacture for the semiconductor package 1000 of FIGS. 1, 2 and 3 according to embodiments of the inventive concept, and FIG. 9 is a cross-sectional view of further illustrating the forming of the sealing member 140.

Referring to FIG. 8A, the semiconductor chip 150 may be mounted on a package substrate 101a. The package substrate 101a may have a planar area in which two or more semiconductor chips 150 may be mounted. The semiconductor chip 150 may be mounted on the package substrate 101a in a face-down (or flip-chip) manner. The chip pads 153 of the semiconductor chip 150 may be electrically and physically connected to the first upper substrate pads 121 of the package substrate 101a through the chip connecting bump 171.

Referring to FIG. 8B, the electromagnetic shield structure 130 is mounted on the package substrate 101a. The electromagnetic shield structure 130 may be mounted on the package substrate 101a to cover the semiconductor chip 150. The side cover 131 of the electromagnetic shield structure 130 may be electrically and physically connected to the second upper substrate pads 122 of the package substrate 101a through the conductive bonding material layer 173.

Referring to FIG. 8C, the sealing member 140 configured to cover and seal the electromagnetic shield structure 130 and the semiconductor chip 150 is formed on the package substrate 101a. The sealing member 140 may cover the outer surface of the electromagnetic shield structure 130, fill the first through holes 133 and the second through holes 137 of the electromagnetic shield structure 130, and fill the internal space (139 of FIG. 9) of the electromagnetic shield structure 130. In some embodiments, the sealing member 140 may fill a gap between the semiconductor chip 150 and the package substrate 101a and may contact the chip connecting bumps 171.

Referring to FIGS. 8C and 9, to form the sealing member 140, the sealing material 180 in a liquid state may be supplied onto the outer surface of the electromagnetic shield structure 130. The sealing material 180 provided on the outer surface of the electromagnetic shield structure 130 may be introduced to the inside of the electromagnetic shield structure 130 through the first through holes 133 of the side cover 131 and the second through holes 137 of the upper cover 135. The sealing material 180 introduced to the inside of the electromagnetic shield structure 130 fills the internal space 139 of the electromagnetic shield structure 130 and may cover the upper surface 155 and the sidewalls 157 of the semiconductor chip 150. Also, the sealing material 180 introduced to the inside of the electromagnetic shield structure 130 may fill a gap between the semiconductor chip 150 and the package substrate 101*a* and surround the chip connecting bumps 171. The first size 133D of the first through holes 133 and the second size 137D of the second through holes 137 may be greater than the particle size 183D of the filler 183 included in the sealing material 180, such that the sealing material 180 may be smoothly introduced to the inside of the electromagnetic shield structure 130 through the first through holes 133 of the side cover 131 and the second through holes 137 of the upper cover 135. For example, the first size 133D of the first through hole 133 and the second size 137D of the second through holes 137 may be at least twice that of the particle size 183D of the filler 183 included in the sealing material 180. Thereafter, the sealing member 140 may be formed by curing the sealing material 180.

Referring to FIG. 8D, the first external connection terminals 161 and the second external connection terminals 162 are attached onto the first lower substrate pads 123 and the second lower substrate pads 124 of the package substrate 101*a*. For example, to form the first external connection terminals 161 and the second external connection terminal 162, solder balls may be attached to the first lower substrate pads 123 and the second lower substrate pads 124 and a reflow process may be performed on the solder balls.

Referring to FIG. 8E, the resulting structure of FIG. 8D may be divided (or singulated) into a number of semiconductor packages 1000, each having a single package size by (e.g.) performing a sawing process. That is, by physically cutting and separating the resulting structures of FIG. 8D along scribe lane SL, individual semiconductor packages 1000 may be obtained.

According to embodiments of the inventive concept, since the semiconductor package 1000 includes an effectively designed electromagnetic shield structure 130 configured to properly shield electromagnetic energy, degradation in performance of the semiconductor package 1000 due to electromagnetic interference may be prevented.

Also, according to embodiments of the inventive concept, since the semiconductor package 1000 includes the sealing member 140 configured to seal the semiconductor chip 150 and the electromagnetic shield structure 130, potential damage to and/or contamination of the semiconductor chip 150 and the electromagnetic shield structure 130 may be prevented. Also, since the electromagnetic shield structure 130 includes through holes configured to allow introduction of a sealing material, the sealing member 140 for sealing the semiconductor chip 150 and the electromagnetic shield structure 130 may be formed through a single sealing process.

While the inventive concept has been particularly shown and described with reference to certain illustrated embodiments thereof, it will be understood by those skilled in the art that various changes in form and detail may be made therein without departing from the spirit and scope of the inventive concept, as defined by the following claims.

What is claimed is:

1. A semiconductor package comprising:
   a package substrate including a substrate pad, the substrate pad configured to be electrically grounded;
   a semiconductor chip on the package substrate;
   an electromagnetic shield structure on the package substrate and including an upper cover covering an upper surface of the semiconductor chip and a side cover surrounding the semiconductor chip; and
   a sealing member comprising an insulating material contacting the semiconductor chip and the electromagnetic shield structure,
   wherein the side cover has first through holes extending laterally through the side cover,
   wherein the upper cover has second through holes extending vertically through the upper cover,
   wherein the electromagnetic shield structure is electrically connected the substrate pad, and
   wherein the sealing member extends into the first through holes and the second through holes.

2. The semiconductor package of claim 1, wherein the sealing member includes an outer portion covering outer surfaces of the electromagnetic shield structure, an inner portion between inner surfaces of the electromagnetic shield structure and the semiconductor chip, first hole fillings filling the first through holes, and second hole fillings filling the second through holes.

3. The semiconductor package of claim 2, wherein the inner portion, the outer portion, the first hole fillings, and the second hole fillings include a same material.

4. The semiconductor package of claim 2, wherein the sealing member includes an epoxy molding compound.

5. The semiconductor package of claim 1, wherein a thickness of the upper cover and a thickness of the side cover range between about 200 μm to about 1,000 μm.

6. The semiconductor package of claim 1, wherein the sealing member includes a filler having a particle size, and a first size of the first through holes and a second size of the second through holes are at least twice the particle size of the filler.

7. The semiconductor package of claim 1, wherein the semiconductor chip is configured to radiate electromagnetic energy at a first wavelength $\lambda$ of a maximum operation frequency, and a first size of the first through holes and a second size of the second through holes are each less than or equal to $\lambda/50$.

8. The semiconductor package of claim 1, wherein a first size of the first through holes and a second size of the second through holes each range between about 0.11 mm to about 1.03 mm.

9. The semiconductor package of claim 1, further comprising:
   first upper substrate pads connecting the semiconductor chip to an internal interconnection pattern within the package substrate; and
   wherein the substrate pad includes a second upper substrate pad configured to physically connect the electromagnetic shield structure.

10. The semiconductor package of claim 9, further comprising:
    a conductive bonding material layer between the second upper substrate pad and the electromagnetic shield structure.

11. The semiconductor package of claim 9, further comprising:
    chip connecting bumps between the first upper substrate pads and the semiconductor chip, wherein the sealing member fills a gap between the semiconductor chip and the package substrate and surrounds the chip connecting bumps.

12. The semiconductor package of claim 1, further comprising:
chip connecting bumps between first upper substrate pads on an upper surface of the package substrate and the semiconductor chip; and
an underfill material layer filling a gap between the semiconductor chip and the upper surface of the package substrate and surrounding the chip connecting bumps.

13. The semiconductor package of claim 1, wherein the side cover includes a first side shielding layer of a first material type and a second side shielding layer of a second material type different from the first material type, the second side shielding layer being stacked on the first side shielding layer, and
the upper cover includes a first upper shielding layer of a third material type and a second upper shielding layer of a fourth material type different from the third material type, the second upper shielding layer being stacked on the first upper shielding layer.

14. The semiconductor package of claim 1, further comprising:
an antenna pattern between the semiconductor chip and the side cover, electrically connected to the semiconductor chip, and configured to communicate radio frequency signals.

15. The semiconductor package of claim 1, wherein the side cover has a rectangular ring-like shape including four segments, and the first through holes penetrate each of the four segments.

16. A semiconductor package comprising:
a package substrate including a base, first upper substrate pads on an upper surface of the package substrate, a second upper substrate pad on the upper surface of the package substrate, and an internal interconnection pattern within the base and connected to the first upper substrate pads;
a semiconductor chip including chip connecting bumps respectively connected to the first upper substrate pads;
an electromagnetic shield structure on the package substrate and including an upper cover covering an upper surface of the semiconductor chip and a side cover surrounding the semiconductor chip, wherein the side cover is electrically connected to the second upper substrate pad and ground; and
a sealing member comprising an insulating material between the semiconductor chip and the electromagnetic shield structure,
wherein the side cover has first through holes extending in a first direction through the side cover,
the upper cover has second through holes extending in a second direction through the upper cover,
the second direction is different from the first direction, and
the sealing member extends into the first through holes and the second through holes.

17. The semiconductor package of claim 16, wherein the sealing member includes a filler having a particle size, and a first size of the first through holes is at least twice that of the particle size,
wherein the first direction is a horizontal direction, and wherein the second direction is a vertical direction.

18. A semiconductor package comprising:
a package substrate including first upper substrate pads on an upper surface of the package substrate and a second upper substrate pad connected to ground and on the upper surface of the package substrate;
a radio frequency integrated circuit mounted on the package substrate using chip connecting bumps respectively connected to the first upper substrate pads, wherein the radio frequency integrated circuit is configured to communicate a radio frequency signal having a wavelength λ;
an electromagnetic shield structure mounted on the package substrate and including an upper cover covering an upper surface of the radio frequency integrated circuit and a side cover surrounding side surfaces of the radio frequency integrated circuit, wherein the side cover is penetrated by regularly spaced first through holes and the upper cover is penetrated by regularly spaced second through holes; and
a sealing member comprising an insulating material disposed between the electromagnetic shield structure and the radio frequency integrated circuit, surrounding the chip connecting bumps, and including a filler having a particle size and filling the first through holes and the second through holes,
wherein a thickness of the upper cover and a thickness of the side cover range between about 200 μm to about 1,000 μm, a first size of the first through holes and a second size of the second through holes are each at least twice that of the particle size, and the first size of the first through holes and the second size of the second through holes are each less than or equal to λ/50,
wherein the electromagnetic shield structure is electrically connected to the second upper substrate pad,
wherein the side cover has first through holes extending laterally through the side cover, and
wherein the upper cover has second through holes extending vertically through the upper cover.

19. The semiconductor package of claim 18, wherein the thickness of the upper cover and the thickness of the side cover are the same,
the first size of the first through holes and the second size of the second through holes are the same, and
a first distance between centers of two adjacent first through holes and a second distance between centers of two adjacent second through holes are the same.

20. The semiconductor package of claim 18, further comprising:
a conductive bonding material layer between the second upper substrate pad and the side cover of the electromagnetic shield structure.

* * * * *